(12) United States Patent
Kermarrec et al.

(10) Patent No.: US 7,879,679 B2
(45) Date of Patent: Feb. 1, 2011

(54) ELECTRONIC COMPONENT MANUFACTURING METHOD

(75) Inventors: Oliver Kermarrec, Gieres (FR); Daniel Bensahel, Grenoble (FR); Yves Campidelli, Grenoble (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 193 days.

(21) Appl. No.: 12/059,497

(22) Filed: Mar. 31, 2008

(65) Prior Publication Data
US 2008/0239625 A1 Oct. 2, 2008

(30) Foreign Application Priority Data
Apr. 2, 2007 (FR) ................................ 07 54201

(51) Int. Cl.
*H01L 21/331* (2006.01)
(52) U.S. Cl. ................... 438/386; 438/221; 438/242; 438/266; 438/393; 438/396; 257/E21.585
(58) Field of Classification Search ................ 438/646
See application file for complete search history.

(56) References Cited
U.S. PATENT DOCUMENTS
6,399,502 B1 * 6/2002 Hernandez et al. .......... 438/692
7,141,866 B1 * 11/2006 Islam et al. ................. 257/628
2004/0241939 A1 12/2004 Beintner et al.
2006/0110936 A1 * 5/2006 Hill et al. .................... 438/778

OTHER PUBLICATIONS

Yamauchi S et al.: *Influence Of Trench Etching On Super Junction Devices*, fabricated by trench filling Power Semiconductor Devices and ICS, 2004. Proceedings. ISPSD 104. The 16$^{th}$ International Symposium on Kitakyushu Int. Conf. Ctr, Japan May 24-27, 2004, Piscataway, NJ, USA,IEEE, May 24, 2004, pp. 193-196, XPOI0723371 ISBN: 4-88686-060-5.
Hausmann D et al.: *Rapid Vapor Deposition Of Highly Conformal Silica Nanolaminates*, Science, American Association for the Advancement of Science US, vol. 298, No. 592, Oct. 11, 2002, pp. 402-406, XP002252801 ISSN: 0036-8075.

* cited by examiner

*Primary Examiner*—N Drew Richards
*Assistant Examiner*—Kyoung Lee
(74) *Attorney, Agent, or Firm*—Lisa K. Jorgenson; James H. Morris; Wolf, Greenfield & Sacks, P.C.

(57) ABSTRACT

A method for manufacturing an electronic component on a semiconductor substrate, including forming at least one opening in the substrate; forming in the bottom and on the walls of the opening and on the substrate an alternated succession of layers of a first material and of a second material, the second material being selectively etchable with respect to the first material and the substrate; trimming the layer portions of the first material and of the second material which are not located in the opening; selectively etching a portion of the first material to obtain trenches; and filling the trenches with at least one third material.

8 Claims, 2 Drawing Sheets

ELECTRONIC COMPONENT MANUFACTURING METHOD

BACKGROUND OF THE INVENTION

1. Field of the Invention

The present invention relates to the field of electronic components, and more specifically to a method for manufacturing high-density electronic components on a substrate. The present invention also relates to structures obtained by this method.

2. Discussion of the Related Art

U.S. Pat. No. 6,399,502 describes a method for manufacturing the structure illustrated in FIG. 1.

In a semiconductor substrate 1, which corresponds to the upper portion of a bulk substrate or to a semiconductor layers resting on an insulating layer (SOI), a rectangular opening 3 is formed. Growths by successive alternated epitaxies of silicon-germanium (SiGe) layers 5, 9, 13 and silicon layers 7, 11, 15 which form on the main upper surface of substrate 1 and on the bottom and the lateral walls of opening 3 are then carried out. Last layer 15 may be made of a material other than silicon, for example, a dielectric, deposited in any appropriate fashion. Once these growths have been carried out, a chem-mech polishing (CMP) is performed to obtain the structure illustrated in FIG. 1 having a planar main upper surface, at the level of which are exposed vertical portions of layers 5, 9, and 13 and of layers 7, 11, and 15 of the stack formed in opening 3.

This method enables obtaining, at the surface of substrate 1, a horizontal succession of patterns formed of different materials, such patterns having small widths and being well controllable. Indeed, silicon-germanium layers 5, 9, and 13 and silicon layers 7, 11, and 15 being formed by epitaxial growths in the bottom and on the lateral walls of opening 3, the vertical portions of these layers are exposed, once the polishing has been carried out, at the surface level of the structure of FIG. 1. The thicknesses of the successive layers become the widths of the patterns formed on the top of the device shown in FIG. 1.

In the art, the widths of patterns buried at the surface of a substrate are generally obtained by photolithographic etch operations. Now, the maskings needed in such methods do not enable obtaining areas of dimensions smaller than a given threshold. The above-described method, which uses well-controlled epitaxial growths, enables obtaining, on the surface of a structure, patterns having dimensions which may be extremely small, for example, on the order of one nanometer.

In U.S. Pat. No. 6,399,502, the portions of the successively-formed layers are directly used to obtain quantum wires, detectors based on silicon-germanium and on silicon, or silicon-based laser structures.

SUMMARY OF THE INVENTION

According to one aspect, the present invention provides, based on the structure shown in FIG. 1, a new method for obtaining electronic components on a solid or semiconductor-on-insulator type semiconductor substrate. The present invention also aims at structures obtained by this method, for example, capacitors or diodes.

To achieve all or part of these objects, as well as others, one embodiment of the present invention provides a method for manufacturing an electronic component on a semiconductor substrate, comprising: forming at least one opening in the substrate; forming in the bottom and on the walls of the opening and on the substrate an alternated succession of layers of a first material and of a second material, the second material being selectively etchable with respect to the first material and with respect to the substrate; trimming the layer portions of the first material and of the second material which are not located in said opening; selectively etching a portion of the first material to obtain trenches; and filling the trenches with at least one third material.

According to an embodiment of the present invention, the third material is deposited by a so-called ALD deposition method.

According to an embodiment of the present invention, the substrate is made of silicon, the first material is silicon-germanium, the second material is silicon, and the structure gathering the substrate, the first material, and the second material is doped of a first conductivity type down to a depth greater than the depth of the opening.

According to an embodiment of the present invention, the silicon-germanium layers and the silicon layers are formed by epitaxy.

According to an embodiment of the present invention, the filling with the third material comprises: depositing an insulating layer in the bottom and on the walls of the trenches and on the substrate; depositing a conductive layer on the insulating layer; and forming a first contact connected to the conductive layer and a second contact connected to the substrate to form a capacitor between the first contact and the second contact.

According to an embodiment of the present invention, the filling with the third material comprises the steps of: depositing at least one doped semiconductor layer of a second conductivity type; and forming a first contact connected to the doped semiconductor layer and a second contact connected to the substrate to form a diode between the first contact and the second contact.

An embodiment of the present invention provides a capacitor comprising, in a silicon substrate provided with an opening, a stack of cups alternately made of silicon-germanium and of silicon, each cup comprising a bottom and vertical walls, the substrate and the cups being doped of a first conductivity type, a portion of the vertical walls of the silicon-germanium cups being removed to form trenches filled with a stack of an insulating material and of a conductive material, contacts being respectively provided on the conductive material and on the substrate.

An embodiment of the present invention provides a capacitor comprising, in a silicon substrate provided with an opening, a stack of cups alternately made of silicon-germanium and of silicon, each cup comprising a bottom and vertical walls, the substrate and the cups being doped of a first conductivity type, a portion of the vertical walls of the silicon-germanium cups being removed to form trenches filled with at least one semiconductor layer of a second conductivity type, contacts being respectively provided on the semiconductor layer and on the substrate.

According to an embodiment of the present invention, the trenches have a width smaller than 10 nm.

The foregoing and other objects, features, and advantages of the present invention will be discussed in detail in the following non-limiting description of specific embodiments in connection with the accompanying drawings.

DETAILED DESCRIPTION

Figure 1:
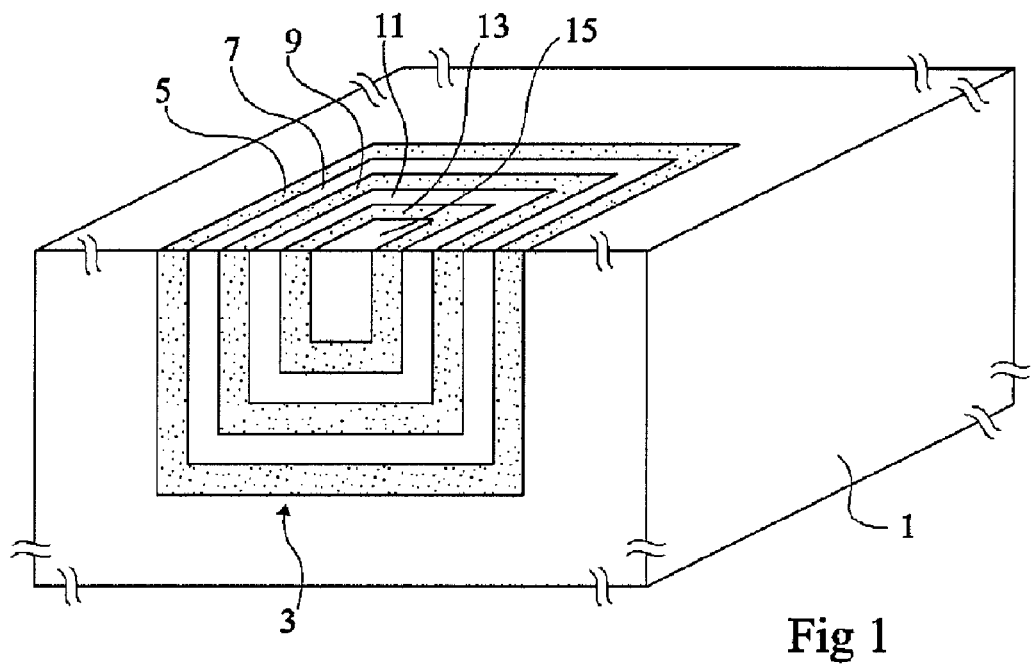
FIG. 1, previously described, is a perspective and cross-section view of the structure obtained by the method described in U.S. Pat. No. 6,399,502.

For clarity, the same elements have been designated with the same reference numerals in the different drawings and, further, as usual in the representation of semiconductor components, the various drawings are not drawn to scale.

The present invention provides a novel method for obtaining electronic components, in which the initial steps are substantially equivalent to those previously described in relation with U.S. Pat. No. 6,399,502 and the final structure of which is illustrated in FIG. 1. Conversely to what has been described in the above-mentioned patent, according to embodiments of the present invention, layers 5, 9, and 13 are not necessarily made of silicon-germanium, layers 7, 11, and 15 are not necessarily made of silicon, and the forming of these layers does not necessarily result from epitaxial growths. More generally, layers 5, 9, and 13 are made of a first material, and layers 7, 11, and 15 are made of a second material, the two materials being selectively etchable with respect to each other and also, preferably, for at least one of them, with respect to substrate 1.

The substrate is doped of a first conductivity type down to a depth greater than the depth of opening 3. In the case where layers 5, 9, and 13 and layers 7, 11, and 15 are semiconductor layers, they are also doped of the first conductivity type. An initial doping of substrate 1 followed by an in situ doping of the various layers during their deposition may then be performed. The doping of the upper portion of substrate 1, of layers 5, 9, and 13 and of layers 7, 11, and 15 may also be performed after forming of these layers, by implantation-diffusion.

Figure 2A:
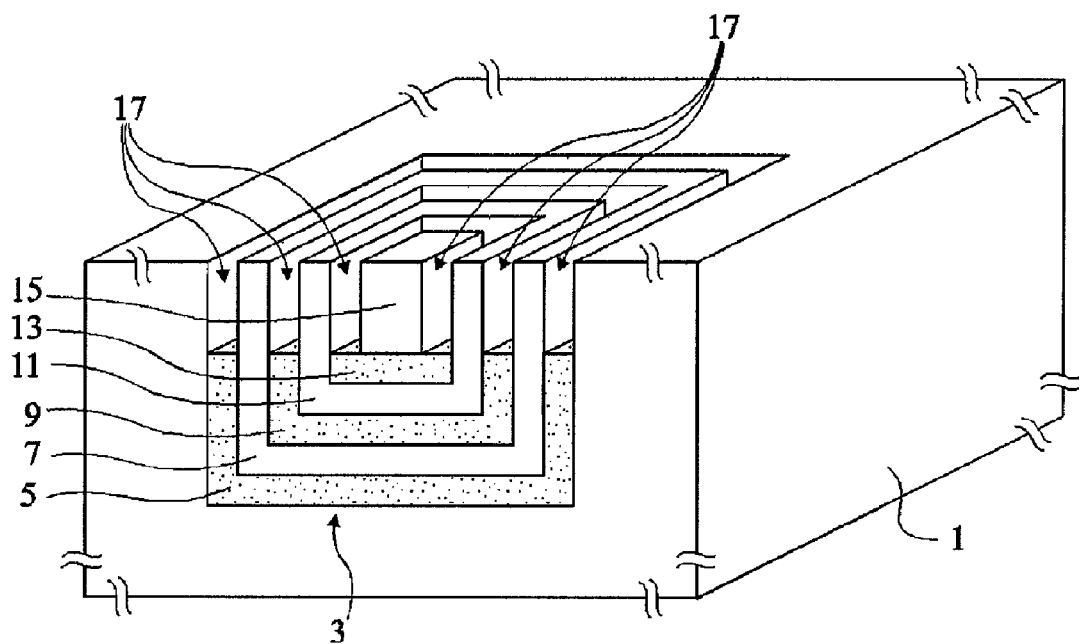
FIGS. 2A to 2C illustrate results of steps of a method for manufacturing a capacitor according to an embodiment of the present invention.

FIG. 2A shows in perspective and cross-section view, the structure obtained, according to a first step of the present invention, after having etched layers 5, 9, and 13 of the first material, the etching being selective with respect to the second material of layers 7, 11, and 15 and with respect to substrate 1. This etching is performed to obtain, instead of the upper part of the vertical portions of layers 5, 9, and 13, trenches 17. Due to the initial forming of layers 5, 9, and 13 and of layers 7, 11, and 15, trenches 17 may have widths of a few nanometers and be distant by a few nanometers only. This selective etch may be performed by any means known in the art according to the nature of the first and second materials and of substrate 1.

Figure 2B:
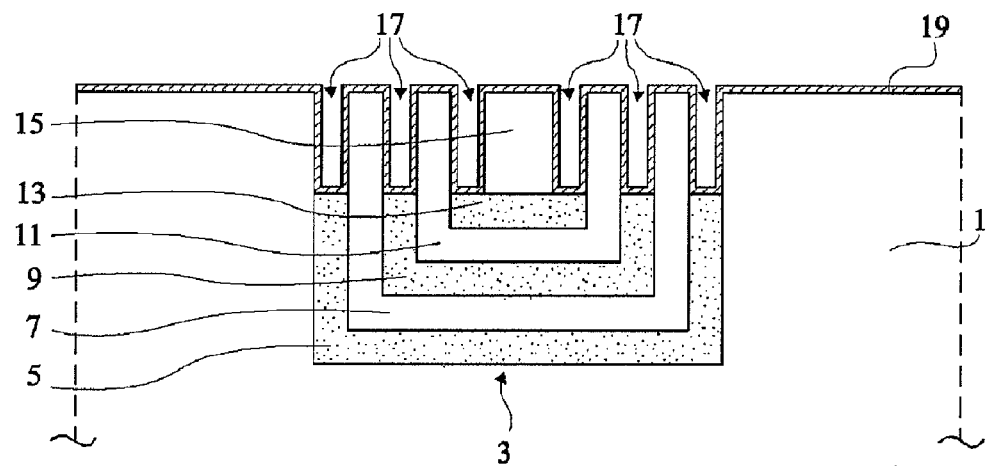
Figure 2C:
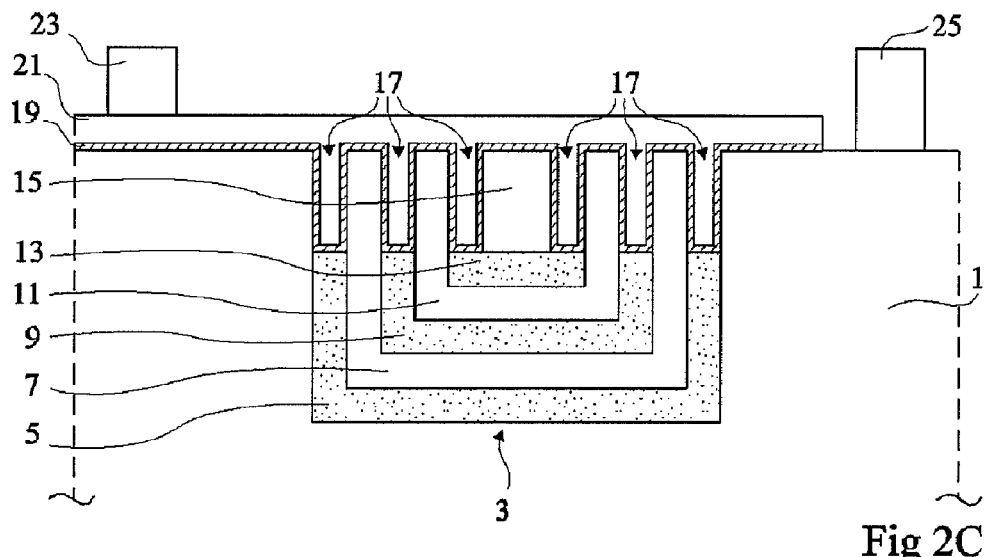

FIGS. 2B and 2C illustrate steps of an embodiment of the present invention applied to the forming of a capacitor having as an initial structure the structure illustrated in FIG. 2A. In this embodiment, layers 5, 9, and 13 and layers 7, 11, and 15 should be conductive layers and at least one upper portion of substrate 1 should be doped, as described hereabove.

FIG. 2B is a cross-section view of the structure obtained after deposition of an insulating layer 19 on the structure of FIG. 2A. Insulating layer 19 extends on the upper surface of substrate 1 and at the bottom and on the walls of trenches 17. A deposition mode adapted to a deposition in very limited areas is selected, such as for example the so-called "ALD" (Atomic Layer Deposition) method or various plasma-assisted or not chemical vapor deposition (CVD) modes, implemented in low kinetics conditions.

FIG. 2C is a cross-section view of the structure obtained after deposition of a conductive layer 21 on insulating layer 19 of the structure of FIG. 2B and after forming of capacitor contacts. Conductive layer 21 extends above layer 19, above substrate 1, and into the space remaining in trenches 17. As an example, this layer 21 may also be formed by ALD.

The assembly of doped substrate 1, of the remaining portions of the conductive layers of the first material 5, 9, 13, and of the conductive layers of the second material 7, 11, 15 forms the first capacitor electrode. Insulating layer 19 forms the capacitor dielectric, and conductive layer 21 forms the second capacitor electrode. Capacitor contacts are then formed. Various contact-forming methods are known in the art. For example, as illustrated in FIG. 2C, it is possible to create a first contact 23 directly on conductive layer 21, and to eliminate from another place of the structure surface a portion of conductive layer 21 and of insulating layer 19 to form second contact 25 which is connected to substrate 1.

Figure 3:
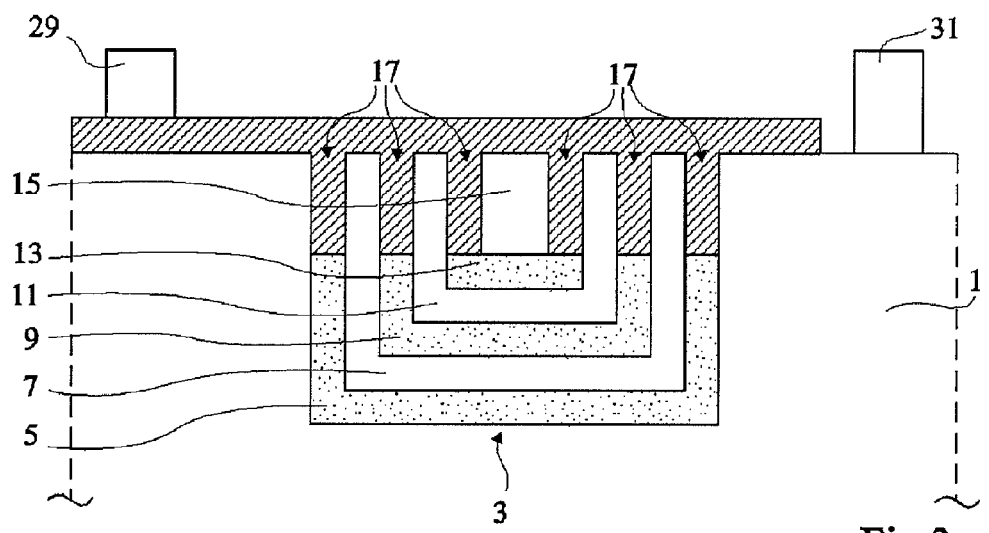
FIG. 3 is a cross-section view of the result of steps of a method for manufacturing a diode according to an embodiment of the present invention.

FIG. 3 is a cross-sectional view of a diode structure according to another embodiment of the present invention. In this structure, layers 5, 9, and 13 and layers 7, 11, and 15 are doped semiconductor layers of a same conductivity type as substrate 1.

In FIG. 3, a semiconductor material 27 has been made to grow by epitaxy on the structure of FIG. 2A. Trenches 17 are thus filled and a semiconductor layer forms on substrate 1. Semiconductor material 27 is a doped material of a conductivity type opposite to that of substrate 1, of semiconductor layers 5, 9, and 13, and of semiconductor layers 7, 11, and 15. As an example, substrate 1, layers 5, 9, and 13, and layers 7, 11, and 15 may be heavily P-type doped and layer 27 may be heavily N-type doped.

The assembly of doped substrate 1, of the remaining portions of doped semiconductor layers 5, 9, and 13, and of doped semiconductor layers 7, 11, and 15 thus forms the first active area of the diode and layer 27 forms the second active area of the diode. It is then proceeded to the diode contact forming. Various contact forming methods are known in the art. For example, as illustrated in FIG. 3, it is possible to create a first contact 29 directly on semiconductor layer 27, and to eliminate from another place of the structure surface a portion of semiconductor layer 27 to form second contact 31, which is connected to substrate 1.

The forming of openings in a substrate by photolithographic etch and the forming of diodes and capacitors along the walls of these openings is known. The active contact area per substrate area unit of these diodes and of these capacitors are then increased, which increases the capacitance per substrate area unit in the case of a capacitor and increases the current density per substrate area unit that a diode can stand. The present invention provides the advantage of forming this structure in trenches having a much smaller dimension than those that can be obtained by photolithographic etch. For a given surface area of the substrate (in top view), the capacitances of the capacitors and the current densities that the diodes can stand are thus increased by the component manufacturing method according to the present invention.

Specific embodiments of the present invention have been described. Various alterations and modifications will occur to those skilled in the art. In particular:

substrate 1 may be a substrate of solid semiconductor type or of semiconductor-on-insulator type; substrate 1 may be made of silicon or germanium;

layers 5, 9, and 13 may be made of silicon-germanium (SiGe) and layers 7, 11, and 15 may be made of silicon. As a variation in the case of the forming of a capacitor, layers 7, 11, and 15 may be made of any other conductive material, and especially of a metal;

layer 19 may be made of any insulating material capable of being deposited in openings of small dimensions, for example, hafnium oxide $HfO_2$;

layer 21 may be made of any doped semiconductor (silicon, germanium, . . . ) or of a metal that can be formed by ALD;

layer 27 may be a silicon, germanium, or silicon-germanium layer.

As a variation, in the case of the manufacturing of a diode, one or several intermediary layers less heavily doped than layer 27 and than the assembly of substrate 1, of layers 5, 9, and 13, and of layers 7, 11, and 15 may be deposited between the two heavily-doped portions, according to the type of diode which is desired to be obtained.

Opening 3 has been illustrated in the drawings as being a rectangular opening, but opening 3 may also take any type of shape, such as for example an opening of circular, hexagonal, or other shape. It is further possible to form several openings in substrate 1.

The etching made at the step of FIG. 2A has been defined as enabling etching the first material of layers 5, 9, and 13 selectively over the second material of layers 7, 11, and 15 and over substrate 1. As a variation, the etching may etch the second material of layers 7, 11, and 15 over the first material of layers 5, 9, and 13 and over substrate 1. A structure different from that of FIG. 2A is then obtained, in which the trenches are not created in the areas of the first material but in the areas of the second material. The next steps of the electronic component manufacturing method then remain identical to those described in relation with FIGS. 2B, 2C, and 3.

In the example shown in relation with the drawings, six layers 5, 7, 9, 11, 13, and 15 of various materials have been formed in opening 3. Of course, opening 3 may contain more or less than six layers of different materials.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an electronic component on a semiconductor substrate, comprising:
    forming at least one opening in the substrate;
    forming in a bottom and on walls of the opening and on the substrate, an alternated succession of layers of a first material and of a second material, the second material being selectively etchable with respect to the first material and with respect to the substrate;
    trimming the layer portions of the first material and of the second material which are not located in said opening;
    selectively etching a portion of the first material to obtain trenches; and
    filling the trenches with at least one third material.

2. The method of claim 1, wherein the third material is deposited by a so-called ALD deposition method.

3. The method of claim 1, wherein the substrate is made of silicon, the first material is silicon-germanium, the second material is silicon, and wherein the structure gathering the substrate, the first material, and the second material is doped of a first conductivity type down to a depth greater than the depth of the opening.

4. The method of claim 3, wherein the silicon-germanium layers and the silicon layers are formed by epitaxy.

5. The method of claim 4, wherein the filling with the third material comprises:
    depositing an insulating layer in the bottom and on the walls of the trenches and on the substrate;
    depositing a conductive layer on the insulating layer; and
    forming a first contact connected to the conductive layer and a second contact connected to the substrate to form a capacitor between the first contact and the second contact.

6. The method of claim 4, wherein the filling with the third material comprises:
    depositing at least one doped semiconductor layer of a second conductivity type; and
    forming a first contact connected to the doped semiconductor layer and a second contact connected to the substrate to form a diode between the first contact and the second contact.

7. A method for manufacturing an electronic component on a semiconductor substrate, comprising:
    forming at least one opening in the substrate;
    forming in a bottom and on walls of the opening and on the substrate, an alternated succession of layers of a first material and of a second material, the second material being selectively etchable with respect to the first material and with respect to the substrate;
    trimming the layer portions of the first material and of the second material which are not located in said opening;
    selectively etching a portion of the first material to obtain trenches; and
    filling the trenches with at least one third material, wherein the filling with the third material comprises:
        depositing an insulating layer in the bottom and on the walls of the trenches and on the substrate;
        depositing a conductive layer on the insulating layer; and
        forming a first contact connected to the conductive layer and a second contact connected to the substrate to form a capacitor between the first contact and the second contact.

8. A method for manufacturing an electronic component on a semiconductor substrate, comprising:
    forming at least one opening in the substrate;
    forming in a bottom and on walls of the opening and on the substrate, an alternated succession of layers of a first material and of a second material, the second material being selectively etchable with respect to the first material and with respect to the substrate;
    trimming the layer portions of the first material and of the second material which are not located in said opening;
    selectively etching a portion of the first material to obtain trenches; and
    filling the trenches with at least one third material, wherein the filling with the third material comprises:
        depositing at least one doped semiconductor layer of a second conductivity type; and
        forming a first contact connected to the doped semiconductor layer and a second contact connected to the substrate to form a diode between the first contact and the second contact.

* * * * *